(12) United States Patent
Carlson

(10) Patent No.: US 7,215,135 B2
(45) Date of Patent: May 8, 2007

(54) SINGLE EVENT UPSET HARDENED CIRCUITRY WITHOUT SENSITIVITY TO OVERSHOOT AND/OR UNDERSHOOT CONDITIONS

(75) Inventor: Roy Carlson, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 113 days.

(21) Appl. No.: 11/002,163

(22) Filed: Dec. 2, 2004

(65) Prior Publication Data

US 2006/0119379 A1    Jun. 8, 2006

(51) Int. Cl.
*H03K 19/007*    (2006.01)
*H03K 19/003*    (2006.01)

(52) U.S. Cl. .............................. 326/14; 326/13; 326/23

(58) Field of Classification Search .............. 326/9–10, 326/13–14, 23, 56–58, 112, 119, 121
See application file for complete search history.

(56) References Cited

U.S. PATENT DOCUMENTS 5,313,094 A * 5/1994 Beyer et al. ................. 257/622
6,018,450 A * 1/2000 Ahmad et al. ................. 361/90
2002/0158674 A1* 10/2002 Ang et al. .................... 327/108

* cited by examiner

*Primary Examiner*—Rexford Barnie
*Assistant Examiner*—Jason Crawford
(74) *Attorney, Agent, or Firm*—McDonnell Boehnen Hulbert & Berghoff LLP

(57) ABSTRACT

An apparatus for hardening logic circuitry against a Single-Event-Effect condition and for providing immunity to an overshoot and undershoot condition is provided. The apparatus includes undershoot-blocking and overshoot-blocking modules that are configured to be coupled to overshoot-insensitive and undershoot-insensitive nodes of the logic circuitry, respectively. The undershoot-blocking module is operable to (i) receive from a first node of the logic circuitry a first signal event having a undershoot condition impressed thereon, and (ii) block it from passing to the overshoot-insensitive node. The overshoot-blocking module is operable to (i) receive from the first node a second signal event having an overshoot condition impressed thereon, and (ii) block it from passing to the undershoot-insensitive node. As such, further propagation of the overshoot and undershoot conditions are prevented.

33 Claims, 5 Drawing Sheets

SINGLE EVENT UPSET HARDENED CIRCUITRY WITHOUT SENSITIVITY TO OVERSHOOT AND/OR UNDERSHOOT CONDITIONS

BACKGROUND

1. Field

The following relates to integrated circuitry, and more particularly, to Single Event Effect ("SEE") hardened circuitry for use with integrated circuitry, such as data storage circuitry. The following is directed toward reducing and/or eliminating the sensitivity of logic circuitry to SEE conditions, and to increasing the immunity of the logic circuitry to undershoot and/or overshoot conditions.

2. Related Art

Integrated circuits used in devices that operate in intergalactic space, earth orbital space, and high atmospheric altitudes (e.g., commercial flight altitudes) generally have to be highly reliable and operate using very low levels of power. Along with these necessities, space, weight and cost limitations generally cause these integrated circuits to be very densely populated and highly complex.

As a consequence of operating in intergalactic space, earth orbital space, and high atmospheric altitudes, however, the integrated circuits are exposed to a large amount of radiation, which can effect their operation and, in turn, their reliability. Because the Earth's magnetic field deflects most outer space radiation, terrestrial-based integrated circuits are not normally exposed to large amounts of radiation. Recently, however, several radiation-laden atmospheric storms, which emanated from a coronal mass ejection of the sun, expanded into space, penetrated the Earth's magnetic field, and disrupted a significant amount of terrestrial-based devices that use integrated circuits.

The disruptions caused by the radiation events are believed to result from Alpha particles (hereinafter "radiation particles") interacting with the semiconductor materials (e.g., silicon) that make up the integrated circuits. These radiation particles are by-products of the natural decay of elements, and/or energetic protons, neutrons, electrons, and all the natural elements. The radiation particles are abundant in a wide range of energies in intergalactic space, earth orbital space, high atmospheric altitudes (e.g., commercial flight altitudes), and, as noted above, terrestrial space.

When a radiation particle interferes with an integrated circuit, it can slow the circuit's performance and even upset circuit operation. For example, a radiation particle can change the conductance of a metal-oxide-semiconductor ("MOS") transistor by changing its threshold voltage $V_t$. In Very Large Scale Integration (VLSI) circuits, radiation particles can also generate significant transient voltage and current disturbances on internal (e.g. power and ground) nodes.

A radiation particle striking and passing through the structure of a transistor (or any semiconductor device) creates hole-electron pair separation along its path or "track." The electrons separated by the radiation particle will migrate towards a high-voltage-state node of the transistor, resulting in a discharging current on the high-voltage node. If the discharging current exceeds, for example, the current holding the high-voltage state on the node, then the high-voltage-state node will transition to an undesired low state. Similarly, holes will migrate towards a low-voltage-state node of the transistor, resulting in a charging current on that node. If the charging current exceeds the current holding the low-voltage state on that node, then the low-voltage-state node will transition to an undesired high state. The result of the flip-flopping of the states of the high-voltage-state and low-voltage-state nodes is that an output of the transistor, and in turn, a larger system into which the transistor is integrated (e.g., a logic gate) may undesirably change.

The number of hole-electron pairs separated along the track length of the radiation particle, however, is finite, so that the nodal voltage disturbances may be temporary or have only a transient effect. In addition, the density of the radiation particles striking the integrated circuit is generally small enough that the disturbances caused by the radiation particles are treated as single events in time. Such transient disturbances are known as single-event transient (SET) conditions.

After experiencing a SET condition, transistor nodes typically return to their desired voltage states. Consequently, the SET condition might not be a problem in and of itself. The consequence of having a temporary voltage disturbance on the transistor node, however, may be problematic because the SET condition may be propagated through the larger system.

For example, if one of the transistor nodes affected by a radiation particle is in a clock network, then the SET condition can generate a false clock pulse in the clock network portion of the system, thereby throwing off the timing of the larger system. If, for example, one of the transistor nodes affected by a radiation particle is in a data storage element, then the SET condition can flip a storage bit of the data storage element to an opposite state. Consequently, the contents of the data storage element are undesirably changed.

When one of the transistor nodes is in a logic device that feeds data to an input of a latch (or flip-flop, register, etc.), there may or may not be a consequence from the SET condition. For example, if the data recovers to a valid state from a SET condition before the latch closes, it may be of no consequence. If, however, the data does not recover to the valid state before the latch closes, then the wrong data state may be loaded into the latch. In any the above examples and/or other cases where the SET condition propagates through a larger system and causes an undesirable change in the state of the larger system, it may be referred to as a Single-Event Upset (SEU) condition.

SEU conditions can be corrected, and thus, are generally called soft errors. The rate at which the soft errors accumulate is called the soft error rate (SER) and is generally equivalent to the SEU rate. If an integrated circuit has more than one sensitive node (i.e., a node that can change states and cause an SEU condition in response to a radiation particle strike), then the SER for each node is summed to define the total SER for the integrated circuit.

For each sensitive node within an integrated circuit, there is a maximum deposited charge that a transistor or set of transistors (and nodal capacitance) can absorb while maintaining the integrated circuit in a desired state. If a charge induced by a radiation particle exceeds the maximum charge threshold for the transistor and/or set of transistors, a change in the state of the integrated circuit can result. The maximum charge threshold for the most sensitive node or nodes is called the critical charge of the circuit.

To evaluate the SER of a logic circuit, it is necessary to consider the maximum current-carrying capability of its transistors. When a radiation particle traverses a node within the logic circuit, it may force the node from its original state to the opposite state for some period of time. If this node is held in the opposite state for a period longer than a delay to trigger the logic circuit's next stage, then this next stage may undesirably switch states.

The length of time that the node is held in its opposite state may depend on several factors. These factors include the total charge deposited on the node, the conductance of the logic circuit's transistors connected to the node, and the delay between a first stage and second stage of the circuit. One way to reduce the chance of having a SEU condition is to increase the conductance of the transistors, and therefore, increase the size of the transistors. This unfortunately increases the size of logic circuit, which is often undesirable, particularly with data-storage elements that are duplicated many times over.

Another way to reduce the chance of having a SEU condition is to add delay time between the stages of the logic circuit. By increasing the delay, an "ON" transistor is given more time to remove the deposited charge before a voltage-state change can propagate sufficiently through the logic circuit to establish a SET condition, and result in a SEU condition.

The delay can be increased by inserting resistors into the path between stages, such as shown in a cross-coupled data storage circuit in FIG. 1. The cross-coupled resistors have proven effective in increasing the critical charge of a latching-type logic circuit, such as data storage circuit. Thus, the cross-coupled data storage circuit provides some tolerance or immunity to SET and SEU conditions (collectively referred to as Single-Event Effects ("SEE")). That is, the cross-coupled data storage circuit is to some extent "radiation hardened." Other equivalent phrases include "radiation hard" or "rad-hard."

However, because the resistors increase the delay in a data storage circuit feedback loop, the time required to deliberately write the data storage circuit is also increased. To overcome a typical SEU condition, the resistors must be of a size that increases the write time by as much as 5 times the write time of a data storage circuit without the cross-coupled resistors. This is a significant performance penalty.

Another limitation of using cross-coupled resistors is that the material of choice is often polysilicon, often with a sheet resistance of about 100 k-ohm/square. In this region, the temperature coefficient of the polysilicon material is typically large. The temperature coefficient can cause write times to change radically with temperature. As known in the art, such radical changes are undesirable in a stable and reliable system.

In the past, increased write time increases were acceptable, but as the number of logic circuits (and the number of transistors thereof) proliferate, the resulting incremental write time increases are unacceptable from a system perspective. Furthermore, the SERs in these larger systems need to decrease to have a stable and reliable system. Removing the cross-coupled resistors to protect for faster write times will only increase the SERs.

In an alternative approach, the delay in the logic circuit can be increased by inserting cross-coupled transistors, which are turned on during a write operation. A RAM-type data storage circuit having two cross-coupled transistors is shown in FIG. 2. The source of each cross-coupled transistor is connected to the output of one of the data storage circuit inverters. The drain of each cross-coupled transistor is connected to the input of the other one of the data storage circuit inverters. Finally, the gate of each cross-coupled transistor is connected to a word line.

The operation of the cross-coupled transistors is similar to a standard data storage circuit with the following exception. When the word line is high, i.e., the cross-coupled transistors are selected and the resistance of the cross-coupled transistor is low because the transistors are "ON." Thus, the cell can be written relatively quickly. When the word line is low, the resistance of the cross-coupled transistors is high because the transistors are "OFF." When the cross-coupled transistors are "OFF," the critical charge of the data storage circuit is increased, thereby providing some level of radiation hardening.

Unfortunately, the cross-coupled transistors must typically be sufficiently "leaky" when turned "OFF" to function properly. Otherwise the data storage circuit would not remain in its desired state without requiring refresh. To make the cross-coupled transistors sufficiently leaky, a resistive element (see FIGS. 3–4) may be coupled in parallel with the cross-coupled transistors. The resistive element must be large enough to provide the necessary SEU hardness for the data storage circuit. When the data storage circuit is to be written to, the resistive element is shorted out by the cross-coupled transistor.

Another approach is suggested by U.S. Pat. No. 6,058,041; issued on May 2, 2002 and entitled "SEU Hardening Circuit" In U.S. Pat. No. 6,058,041, a SEU hardening circuit consisting of a bypass circuit in the form of a transmission-gate-bypass circuit in parallel with a highly-resistive resistor may be inserted between the first and second stages to reduce the SEE.

This bypass circuit and the previously discussed circuitry, however, may be sensitive to voltage overshoot and/or voltage undershoot conditions. Such overshoot or undershoot conditions can occur, for example, on the input terminal of the SEU hardening circuit as a result of an SET condition upstream from (i.e., before) the bypass circuit. The consequences of such conditions can forward bias a diode and/or turn on one of the transistors in the bypass circuit, thereby undesirably performing the function of bypassing or shorting out the high resistance portion of the circuit. Overshoot and undershoot conditions become more problematic as (i) technology scales down transistor feature sizes, (ii) diode forward bias voltages remain roughly constant, and (iii) transistor turn-on thresholds decrease below diode forward bias voltages. As such, an overshoot or undershoot condition with a magnitude of a forward-bias-diode voltage drop can undesirably turn on the transistors. This, in turn, reduces the logic circuitry's immunity to SEE conditions.

What is needed, therefore, is a system and method that reduces or eliminates the sensitivity to overshoot and undershoot conditions, while increasing the SEE immunity of the circuitry.

SUMMARY

In one aspect, an apparatus for hardening logic circuitry against a Single-Event-Effect (SEE) condition and for providing immunity to an overshoot and undershoot condition is provided. The apparatus includes undershoot-blocking and overshoot-blocking modules that are configured to be coupled to overshoot-insensitive and undershoot-insensitive nodes of the logic circuitry, respectively.

The undershoot-blocking module is operable to (i) receive from a first node of the logic circuitry a first signal event having a undershoot condition impressed thereon, and (ii) block it from passing to the overshoot-insensitive node. The overshoot-blocking module is operable to (i) receive from the first node a second signal event having an overshoot condition impressed thereon, and (ii) block it from passing to the undershoot-insensitive node. As such, further propagation of the overshoot and undershoot conditions are prevented.

In a second aspect, the undershoot-blocking module is further operable to receive the second signal event from the first node and to pass it to the overshoot-insensitive node, whereby the overshoot-insensitive node prevents further propagation of the overshoot condition. Similarly, the overshoot-blocking module is further operable to receive the first signal event from the first node and to pass it to the undershoot-insensitive node, whereby the undershoot-insensitive node prevents further propagation of the undershoot condition.

In a third aspect, the undershoot-blocking module is operable to provide high-impedance signal path between the first and overshoot-insensitive nodes when operating in a first state. Similarly, the overshooting blocking modules is operable to provide high-impedance signal path between the first and undershoot-insensitive nodes when operating in a first state. When operating in a second state, however, the undershoot-blocking module is operable to provide a low resistance path between the first and overshoot-insensitive nodes, and the overshoot-blocking module is operable to provide a low resistance path between the first node and the undershoot-insensitive node.

Additionally, the undershoot-blocking module is operable to provide to the overshoot-insensitive node a full-rail inactive signal level and the overshoot-blocking module is operable to provide to the undershoot-insensitive node a full-rail inactive signal level. As such, when the overshoot and undershoot-insensitive nodes receive an inactive signal level any circuit connected to the overshoot and undershoot-insensitive nodes are turned off with no static current dissipation.

BRIEF DESCRIPTION OF THE DRAWINGS

Presently preferred embodiments of the invention are described below in conjunction with the appended Figures, wherein like reference numerals refer to like elements in the various Figures, and wherein.

DETAILED DESCRIPTION OF PRESENTLY PREFERRED EMBODIMENTS

Figure 1:
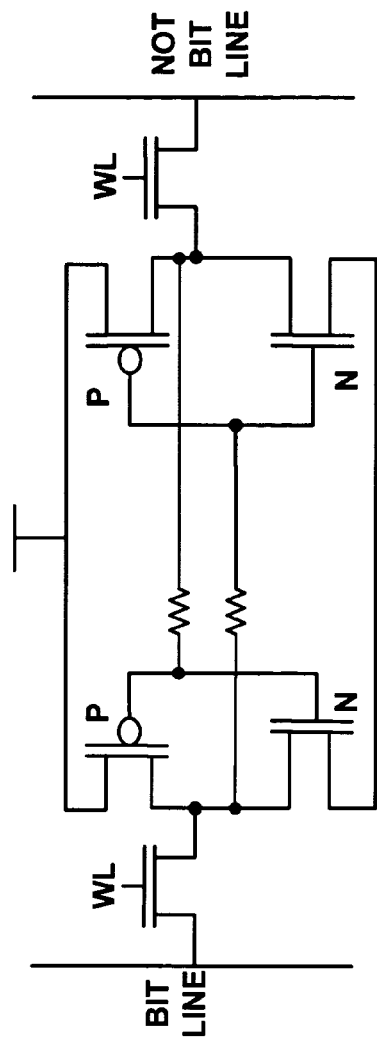
FIG. 1 is a schematic diagram of a data storage circuit using cross-coupled resistors as found in the prior art.
Figure 2:
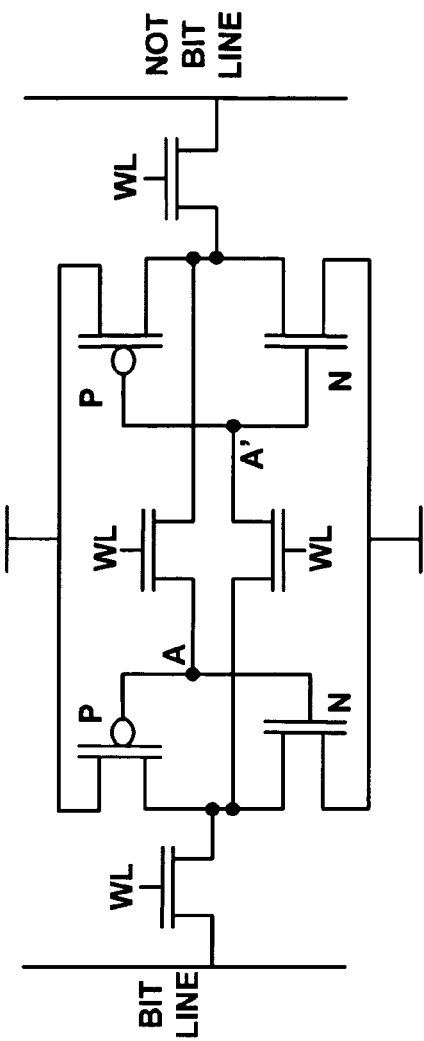
FIG. 2 is a schematic diagram of a data storage circuit using cross-coupled transistors as found in the prior art.
Figure 3:
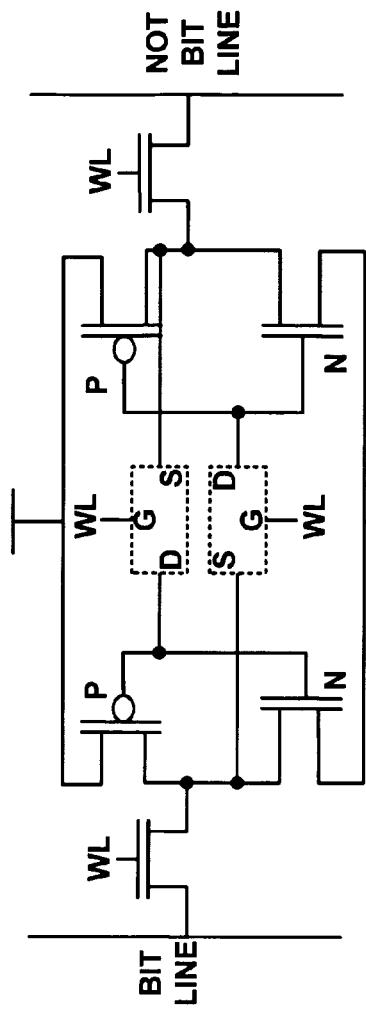
FIG. 3 is a schematic diagram of a data storage circuit using cross-coupled transistor coupling elements, as found in the prior art.
Figure 4:
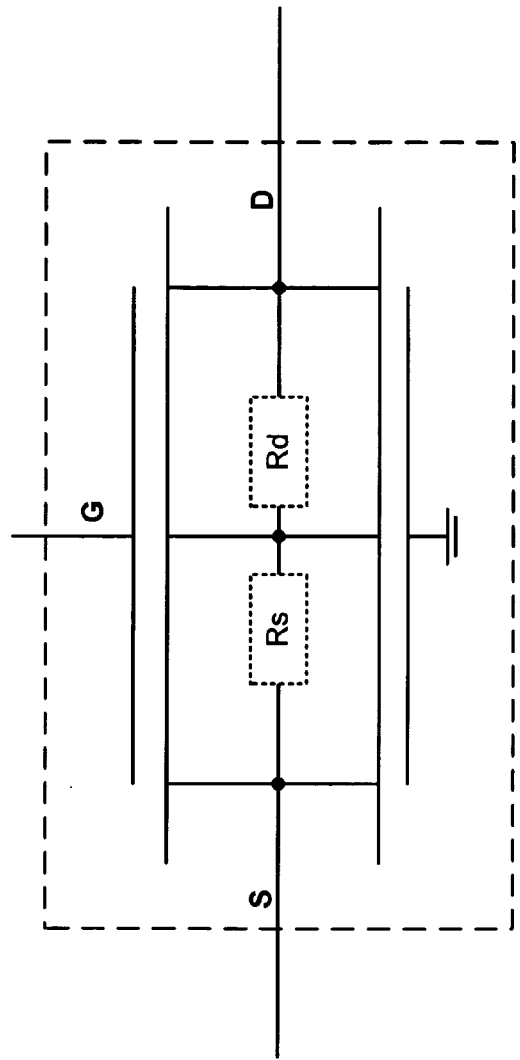
FIG. 4 is a schematic diagram detailing one of the transistor coupling elements of FIG. 3.
Figure 5:
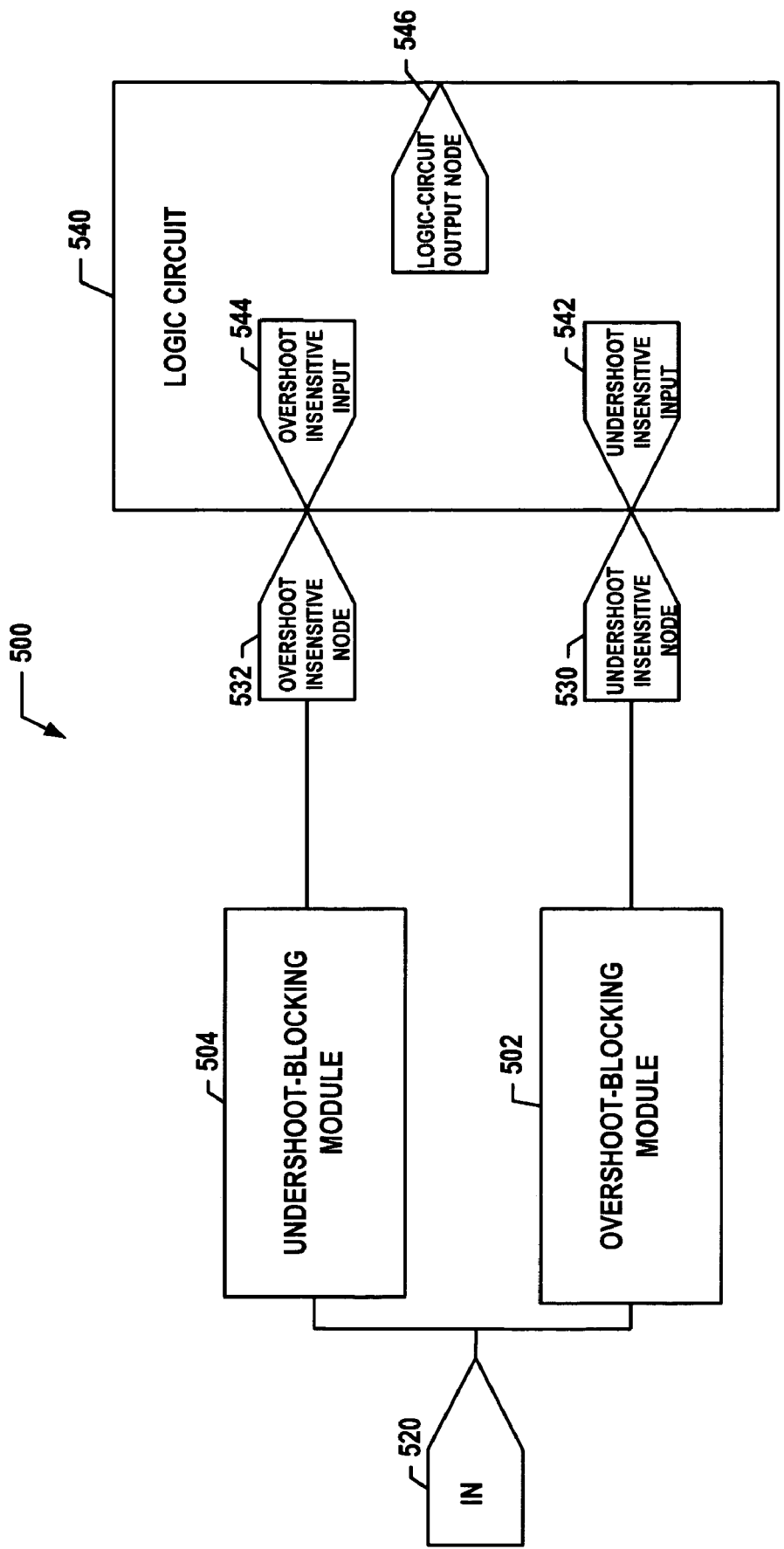
FIG. 5 is a block diagram illustrating a single event upset (SEU) hardening circuit for providing immunity to voltage overshoot and/or undershoot conditions.

FIG. 5 is a block diagram illustrating an SEU hardening circuit 500 that provides immunity to voltage overshoot and/or undershoot conditions. The SEU hardening circuit 500 (or multiples thereof) may be placed between a first and second stage of a larger integrated or integral system.

As noted above, voltage overshoot and undershoot conditions may occur in integrated circuits due to radiation particles striking one or more "PN" junction regions of such integrated circuits. An overshoot condition can result from a radiation-particle strike that causes a voltage level on a node of the integrated circuit to exceed a nominal power voltage (e.g., a nominal $V_{DD}$ or a logic-1 level). Conversely, an undershoot condition can result from a radiation-particle strike that causes a voltage level on a node of the integrated circuit to fall below a nominal ground voltage (e.g., nominal $V_{SS}$, Ground or a logic-0 level).

To provide immunity against such voltage overshoot and/or undershoot conditions, the SEU hardening circuit 500 may be deployed with an overshoot-blocking module 502 and an undershoot-blocking module 504, both of which are connected in common at an input node 520 of the SEU hardening circuit 500. The overshoot-blocking module 502 may provide a first output-signal path between the input node 520 and an undershoot-insensitive node 530. The first output-signal path may be configured to block a voltage overshoot condition, but pass a voltage undershoot condition.

The undershoot-blocking module 504 may provide a second output-signal path between the input node 520 and an overshoot-insensitive node 532. The second output-signal path may be configured as a complement of the first output-signal path. That is, the second output-signal path may be configured to block a voltage undershoot condition, but pass a voltage overshoot condition.

The undershoot-insensitive and overshoot-insensitive nodes 530, 532 are typically coupled to respective undershoot-insensitive and overshoot-insensitive inputs of the second stage. For example, the undershoot-insensitive and overshoot-insensitive nodes 530, 532 may be respectively coupled to undershoot-insensitive and an overshoot-insensitive inputs 542, 544 of logic circuit 540. The logic circuit 540, in turn, provides a logic-circuit-output signal from its output node 546 after performing logical operations on signals received on the input node 520.

The undershoot-insensitive input 542 is insensitive to an undershoot condition in that signals resulting from an undershoot condition received on such node do not cause the logic-circuit-output signal to undesirably change state. Similarly, the overshoot-insensitive input 544 is insensitive to an overshoot condition in that signals resulting from an overshoot condition received on such node do not cause the logic-circuit-output signal to undesirably change state.

As such, when undershoot and/or overshoot conditions occur, the SEU hardening circuit 500 prevents further propagation of the voltage undershoot and/or overshoot condition. The SEU hardening circuit 500 is not limited to only providing immunity to voltage undershoot and/or overshoot conditions, but may employ other functions, such as providing full-rail turn-off signals and/or providing protection against susceptibility to parasitic bipolar gain effects.

Exemplary Architecture of a Latch Circuit Incorporating a SEU Hardening Circuit

Figure 6:
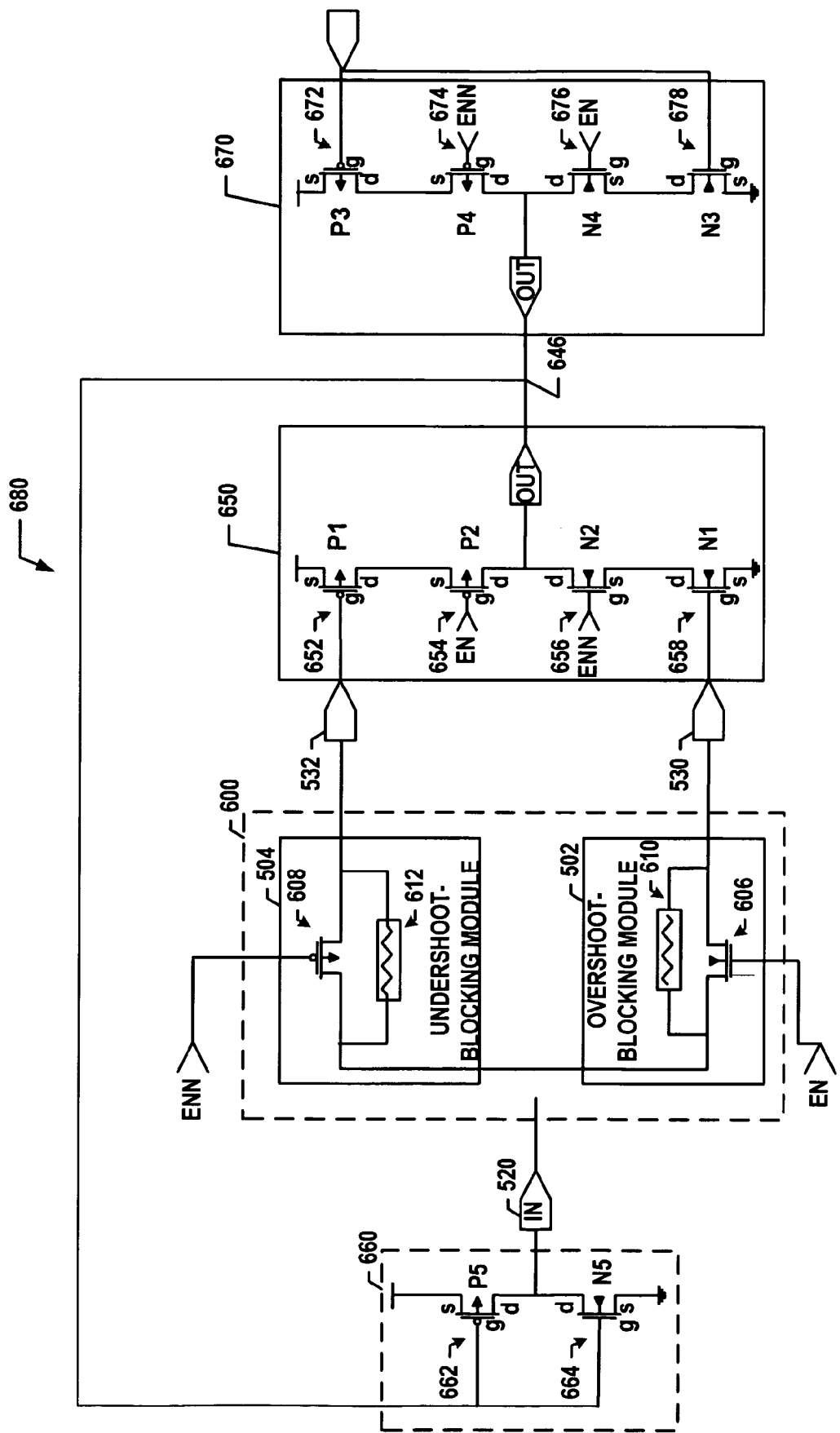
FIG. 6 is a circuit diagram illustrating a latch circuit that incorporates an alternative embodiment of an SEU hardening circuit for providing immunity to voltage overshoot and/or undershoot conditions.

FIG. 6 is a circuit diagram illustrating a latch circuit 680 that incorporates an alternative embodiment of an SEU hardening circuit, namely, the SEU hardening circuit 600. The latch circuit 680 is formed by a combination of a first tristate inverter 650, an inverter 660, a second tristate inverter 670, and the SEU hardening circuit 600.

The first tristate inverter 650 may be used to modify a data storage element (not shown), and may be constructed using two or more serially coupled or "stacked" transistors (collectively referred to as a "transistor stack"). The construction and transistor-interconnection attributes of the transistor stack may be operable to prevent energetic or radiation particles from turning on or flipping the state of all the transistors in the transistor stack, thereby providing a level of hardening against SEE conditions. Details of regarding the construction and transistor-interconnection attributes of an exemplary transistor stack may be found in U.S. patent application Ser. No. 10/759913, filed on Jan. 15, 2004 and entitled: "Radiation Hardening of Logic Circuitry using a Cross-enabled, Interlocked Logic System and Method."

The transistor stack of the first tristate inverter 650 may be, for example, formed from first and second serially-coupled P-Channel transistors coupled in series with first and second serially-coupled N-Channel transistors. In one of the possible four-transistor stack configurations, the source of a first P-Channel transistor ("P1 transistor") 652 is coupled to $V_{DD}$. The drain of the P1 transistor 652 is coupled to the source of a second P-Channel transistor ("P2transistor") 654. The drain of the P2 transistor 654, in turn, intersects with the drain of a second N-Channel transistor ("N2 transistor") 656. The source of the N2 transistor 656 is coupled to the drain of a first N-Channel transistor ("N1 transistor") 658. The source of the N1 transistor 658, in turn, is coupled to $V_{SS}$.

The body ties of the transistors 652–658 may be configured so as to be hardened against SET and/or SEU conditions. For example, each of the transistors in the hardened N-Channel and P-Channel transistors 652–658 may have its body tie coupled to its source, thereby providing no discharge path for split hole-electron pairs to discharge to the appropriate supply, e.g., $V_{DD}$ and/or $V_{SS}$. However, other connections are possible as well. Details of these and other exemplary body-tie configurations may be found in the aforementioned U.S. patent application Ser. No. 10/759913.

The gates of the P1 and N1 transistors 652, 658 are coupled to the overshoot-insensitive node 532 and the undershoot-insensitive node 530, respectively. Through these nodes the first tristate inverter 650 may be operable to receive data for storage.

The gates of the N2 and P2 656, 654 are configured to receive from a clock generator a timing or enable ("EN") signal and its complement (i.e., the ENN signal), respectively. The EN and ENN signals may be supplied by various clocking circuitry, such as a clocking generator. Details of an exemplary clocking circuitry may be found in the aforementioned U.S. patent application Ser. No. 10/759913. When the EN and ENN signals are in a high and low state, respectively, the N2 and P2 transistors 656, 654 may cause the first tristate inverter 650 to store data corresponding to the state of the gates of the P1 and N1 transistors 652, 658.

An output terminal, which is operable to provide a first output ("OUT-1") signal, is provided at the intersection of the drains of the P2 and N2 transistors 654, 656 and is coupled to node 646. Using the OUT-1 signal, first tristate inverter 650 is operable to drive an input of the inverter 660 via its connection to node 646.

The second tristate inverter 670 may be formed from a transistor stack similar to the first tristate inverter 650. For example, the transistor stack of the second tristate inverter 670 may be formed from third and fourth serially-coupled P-Channel transistors coupled in series with third and fourth serially-coupled N-Channel transistors.

As shown, the source of a third P-Channel transistor ("P3 transistor") 672 is coupled to $V_{DD}$. The drain of the P3 transistor 672 is coupled to the source of a second P-Channel transistor ("P4 transistor") 674. The drain of the P4 transistor 674 intersects with the drain of a second N-Channel transistor ("N4 transistor") 676. The source of the N4 transistor 676, in turn, is coupled to the drain of a third N-Channel transistor ("N3 transistor") 678. The source of the N3 transistor 678 is coupled to $V_{SS}$. The body ties of the transistors 672–678 may be configured so as to be hardened against SET and/or SEU conditions, as noted above with respect to transistors 675–658.

The gates of the N4 and P4 transistors 676, 674 may be configured to pass the state of the P3 and N3 transistors 672, 678 to the output terminal of the second tristate inverter 670 when the EN and ENN signals are in a high and low state, respectively. The remaining two transistor gates (i.e., the gates of the P3 and N3 transistors 672, 678) are coupled together and driven by a data signal (not shown).

An output terminal, which is operable to provide a second output ("OUT-2") signal, is provided at the intersection of the drains of the P4 and N4 transistors 674, 676 and is coupled to node 646. Using the OUT-2 signal, second tristate inverter 650 is operable to drive an input of the inverter 660 via its connection to node 646.

While it may be constructed in any number of ways, the inverter 660, as illustrated, may be formed from a two-transistor stack, namely, a fifth P-Channel transistor ("P5 transistor") 662 coupled in series with a fifth N-Channel transistor ("N5 transistor") 664. The gates of the P5 and N5 transistors 662, 664 may be tied together to provide the input to the inverter 660. As noted, both of the OUT-1 and OUT-2 signals may be applied to the node 646 to drive the input of the inverter 660.

The source of the P5 transistor 662 is coupled to $V_{DD}$, and the source of the N5 transistor 664 is coupled to $V_{SS}$. The drain of the P5 transistor 662 is coupled to the drain of the N5 transistor 664. An output terminal of the inverter 660 is provided at the node formed by the intersection of these drains. The output terminal of the inverter 660 is connected to the input of the SEU hardening circuit 600 at input node 520. Through this node, the inverter 660 may apply its output signal to drive the SEU hardening circuit 600.

As shown and as described in more detail below, the SEU hardening circuit 600 is operable to drive the first tristate inverter 650. To facilitate this, the SEU hardening circuit 600 may be deployed with the overshoot-blocking and undershoot-blocking modules 502, 504, both of which are connected in common at the input node 520 of the SEU hardening circuit 600. The overshoot-blocking and undershoot-blocking modules 502, 504, in turn, may be respectively coupled to undershoot-insensitive and overshoot-insensitive nodes 530, 532, and in turn, to inputs of the first tristate inverter 650.

The overshoot-blocking module 502 may be deployed with one or more bypassing N-Channel transistors, such as N-Channel transistor ("N-bypass transistor") 606, coupled in parallel with a first high-resistance circuit 610. Similarly, the undershoot-blocking module 504 may be deployed with one or more bypassing P-Channel transistors, such as P-Channel transistor ("P-bypass transistor") 608, coupled in parallel with a second high-resistance circuit 612.

The body ties of the N-bypass and P-bypass transistors 606, 608 may be left floating (as shown). This is relatively easy to do using a device-insulating technology, such as a Silicon-On-Insulator ("SOI") technology. While more difficult, the body ties of the N-bypass and P-bypass transistors 606, 608 may be floated using a Bulk technology, such as Bulk CMOS, as well. Floating the body ties may reduce the overall SER of the data storage element.

Alternatively, the body tie of the N-bypass transistor 606 may be coupled to $V_{SS}$. Similarly, the body tie of the P-bypass transistor 608 may be coupled to $V_{DD}$. The connection of the body of the P-bypass and N-bypass transistors 606, 608 may affect the overall SER of the circuit.

The drain of the N-bypass transistor 606 may be coupled to the undershoot-insensitive node 530 and, in turn, to the undershoot-insensitive input of the tristate inverter 650. The source terminal of the P-bypass transistor 608 may be coupled to the overshoot-insensitive node 532 and, in turn, to the overshoot-insensitive input of the tristate inverter 650.

The source and drain of the respective N-bypass and P-bypass transistors 606, 608 are coupled in common at the input node 520. The first high-resistance circuit 610 is typically coupled across the drain and source of the N-bypass transistor 606. The second high-resistance circuit 612 is typically coupled across the drain and source of the P-bypass transistor 608.

The drain and source terminology used herein with respect to the N-bypass and P-bypass transistors 606, 608 is for convenience only, and such usage is not intended to limit the meanings of the drain and source terms to their conventional meanings. As is readily apparent, both of the N-bypass and P-bypass transistors 606, 608 are capable of driving both high and low logic levels, and thus, the meaning of the drain and source terms can be interchanged without affecting the operation of the circuit.

The first and second high-resistance circuits 610, 612 may be constructed from one or more resistive modules and/or components. Depending on the desired resistance, the resistive modules and/or components may be coupled serially or in parallel coupled across the source and drain of the N-bypass and P-bypass transistors 606, 608. The resistive modules and/or components may include other components, and may be coupled to different points on the respective overshoot-blocking and undershoot-blocking modules 502, 504.

The purpose of the first and second high-resistance circuits 610, 612 is to provide an increased RC delay between input node 520 and the undershoot-insensitive or overshoot-insensitive nodes 530, 532. For a detailed description of sensitive volumes of transistors, see the aforementioned U.S. patent application Ser. No. 10/759913.

Under certain conditions, the N-bypass transistor 606 is operable to drive a first input of the first tristate inverter 650 (via node 530) by bypassing a high-resistance circuit 610 that is likewise coupled to node 530. Similarly, the P-bypass transistor 608, under certain conditions, is operable to drive a second input the first tristate inverter 650 (via node 532) by bypassing its high-resistance circuit 612 that likewise coupled to node 530.

For example, under normal operating conditions, the N-bypass and P-bypass transistors 606, 608 are operable to bypass their respective high-resistance circuits 610, 612 when the EN signal is a logic-1 state and the ENN signal is in a logic-0 state, thereby allowing the second tristate inverter 670 to write new data into the latch circuit 680. On the other hand, when the EN signal is in a logic-0 state and the ENN signal is in a logic-1 state, the tristate inverter 650 is operable to latch data in the latch circuit 680, but the N-bypass and P-bypass transistors 606, 608 do not bypass their respective high-resistance circuits 610, 612. Since the N-bypass and P-bypass transistors 606, 608 do not bypass their respective high-resistance circuits 610, 612, any transition on the nodes 520 or 646 has to pass through the high resistance circuits 610, 612.

As a result of technology scaling, forward-bias voltages for diodes are presently remaining roughly constant at around 0.7 V, but transistor turn-on thresholds are generally decreasing. Turn-on thresholds for 0.15 urn technology transistors, for example, are currently at about 0.4–0.5 Volts. Consequently, an undershoot condition with magnitude of a forward bias diode voltage drop can turn on the N-bypass transistor 606, and an overshoot condition with a magnitude of a forward bias diode voltage drop can turn on the P-bypass transistor 608. However, with the N-bypass and P-bypass transistors 606, 608 connected between the input node 520 and the undershoot-insensitive input and overshoot-insensitive inputs of the first tristate inverter 650, respectively, the overshoot and/or undershoot conditions are not further propagated.

When a particle strikes the sensitive volumes on one or more devices upstream from the input node 520 and propagates an error signal thereon, the first and second high-resistance circuits 610, 612 may significantly delay the voltage state change on nodes 530, 532. This allows more time for the devices upstream (i.e., before) from the hardening circuit 600 to remove the deposited charge on input node 520 and restore it to its original state. The larger the resistor (or the larger the total RC delay in the feedback loop due to multiple placements of the SEU hardening circuit), the more deposited charge the circuit can tolerate without experiencing an SEU condition.

In addition to providing overshoot protection, the N-bypass transistor 606 provides full-rail turn-off of the N1 transistor 658 in a negative voltage direction by bypassing (i.e., shorting across) the first hardening high-resistance circuit 610 and supplying a full rail logic0level on node 530. Similarly, the P-Channel transistor 608 provides full rail turn-off of the P1 transistor 652 in the positive voltage direction by bypassing the second hardening high-resistance circuit 612 and supplying a full rail logic-1 level on node 532. As indicated above, full-rail turnoff may prevent significant leakage current in the first tristate inverter 650.

To facilitate the write operation during which a new data state must be propagated to nodes 530 and 532, the gates of the N-bypass transistor 606 and P-bypass transistor 608 may be respectively coupled to the EN signal and the ENN signal. When the EN signal is in a high state (and the ENN signal is in a low state), both of the N-bypass and P-bypass transistors 606, 608 switch to an ON state and effectively short the first and second high-resistance circuits 610, 612, respectively.

The input node 520 of the N-bypass and P-bypass transistors 606, 608, however, may be sensitive to respective voltage overshoot and undershoot conditions, which can occur on the input terminal of the SEU Hardening circuit 600 as a result of a radiation particle striking, for example, a reverse biased PN junction of a device connected to input node 520, such as the inverter 660.

If the inverter 660 is used to supply a logic-0 level, for example, on input node 520, then a reverse biased PN junction exists on a drain of the P5 transistor 662. And if the gate terminal of transistors 606, 608 (EN and ENN) are at $V_{ss}$ and $V_{DD}$, respectively, then transistors 606 and 608 are in a non-conducting or "off" state and any voltage changes on the input node 520 do not propagate to the input of the first tristate inverter 650 at nodes 530 and 532.

The foregoing illustrates an exemplary embodiment of the SEU hardening circuit 600 as part of the latch circuit 680.

The SEU hardening circuit 600, however, may be used to drive other circuitry, such as simple inverters, feed-forward or feedback inverters, other latch circuitry and/or flip-flop circuitry. Further, the SEU hardening circuit 600 may be used with any type of data storage element, including a memory cell, latch, register, etc. Moreover, the SEU hardening circuit 600 (or multiples thereof), like the SEU hardening circuit 500, may be placed between first and second stages of a larger integrated or integral system.

Exemplary Operation of a SEU Hardening Circuit

Under normal operation, when data at the input node 520 is at a high or a logic-1 state and the EN signal is in a high state, then the N-bypass transistor and N1 transistors 606, 658 and are both in an ON state. Similarly, when data at the input node 520 is at a logic-0 state and the ENN signal is in a low state, then the P-bypass and P1 transistors 608, 652 are both in an ON state.

If, however, the EN signal is in a low state and ENN is in a high state, the N-bypass and P-bypass transistors 606, 608 are in an OFF state, and the P2 and N2 transistors 654, 656 may be in an ON state. Depending upon the data state written into node 532 and 530, either P1 or N1 transistors 652, 658 will be in an ON state. As a result, data written to node 532 and 530 is retained by the first tristate inverter 650 on node 646.

When N-bypass and P-bypass transistors 606 and 608 are in an OFF state, P1 and N1 transistors 652, 658 remain in their respective last state, due in part, to a charge mechanism (not shown), such as a capacitor or the internal capacitor of the transistors themselves, coupled to the transistor's gates. A small amount of charge leakage on nodes 532 and 530 can be replenished by a small current flow through the high-resistance circuits 612, 610. Table 1 below summarizes the typical operational states of the SEU hardening circuit 600 combined with the first tristate inverter 650.

TABLE 1

| Input (IN) | EN | ENN | P-bypass | N-bypass | P1 | N1 | OUT |
|---|---|---|---|---|---|---|---|
| 0 | 0 | 1 | OFF | OFF | Last State | Last State | Last State |
| 1 | 0 | 1 | OFF | OFF | Last State | Last State | Last State |
| 0 | 1 | 0 | ON | ON | ON | OFF | 1 |
| 1 | 1 | 0 | ON | ON | OFF | ON | 0 |

Tristate inverters typically provide the ability to float or "tri-state" their outputs when inactive clock signal logic levels are present on the inputs. For example if the gate of P2 transistor 654 is at a logic-1 state and the gate of N2 transistor 656 is at a logic-0 state, then the first tristate inverter 650 is in a tristate mode. This occurs because there is no available path through an ON transistor from node 646 to either $V_{DD}$ or $V_{SS}$.

Given that the gates of the P1 and N1 transistors 652, 658 are separately coupled to the overshoot-insensitive node 532 and the undershoot-insensitive node 530, respectively, the tristate condition can also occur due to unexpected logic levels on the gates of P1 and N1 transistors 652, 658. As such, the first tristate inverter 650 may tristate its output.

During the time when the first tristate inverter 650 is in a tristate mode, the output at node 646 maintains its present state due to charge storage on capacitances that, although not shown in FIG. 6 are inherent in all integrated circuits. In other words, the transition of the first tristate inverter 650 into a tristate mode does not cause its output to immediately change logic state. Details of the operation of an exemplary hardened tristate inverter may be found in aforementioned U.S. patent application Ser. No. 10/759913.

As noted, when a particle strikes a device in the first stage such that the input node 520 experiences an overshoot condition (e.g., a voltage at or above a normal logic-1 state), this condition can turn on the P-bypass transistor 608, thereby passing the overshoot condition to the overshoot-insensitive node 532 and on to the P1 transistor 652. The overshoot condition, on the other hand, does not turn on the N-bypass transistor 606, thereby blocking the overshoot condition from propagating to the undershoot-insensitive node 532 and on to the N1 transistor 658.

When ENN is a logic-1 state and EN is a logic-0 state, then N2 and P2 transistors 656, 654 are both ON, thereby enabling the first tristate inverter 650. When enabled, the logic value present on nodes 532 and 530 (ideally the same under normal operation) is inverted and propagated to node 646. For example, a logic-0 state is propagated to node 646 when (i) the first tristate inverter 650 is enabled, and (ii) a logic-1 state is written to nodes 532 and 530 (i.e., when the P1 transistor 652 is in an OFF state and the N1 transistor 658 is in an ON state).

As such, passing the overshoot condition to the P1 transistor 652 does not affect the output signal of the first tristate inverter 650. This occurs because the overshoot condition pulls the gate of the P1 transistor 652 to a voltage greater than its threshold voltage, keeping the P1 transistor 652 in an OFF state (assuming, as described above, that the P1 transistor 652 was already in an OFF state).

On the other hand, if a logic-0 state is written to the nodes 530 and 532, then the P1 transistor 652 is in an ON state and the N1 transistor 658 is in an OFF state. Here, the overshoot condition may cause the P1 transistor 652 to transition to an OFF state.

As a result of the overshoot condition, both of the P1 and N1 transistors 652, 658 are in an OFF state, and the output of the first tristate inverter 650 floats or "tri-states." In the tristate mode, the first tristate inverter 650 leaves the output signal of the first tristate inverter 650 unchanged, even in the presence of an overshoot condition on input node 520.

The N-bypass transistor 606 may be susceptible to an undershoot condition (e.g., a voltage at or below a normal zero state) on the input node 520. Contrary to the P-bypass transistor 608, the undershoot condition can turn on the N-bypass transistor 606. As such, the undershoot condition can be passed to the undershoot-insensitive node 530 and, in turn, to the N1 transistor 658. The undershoot condition does not turn on the P-bypass transistor 608, and thereby blocks the undershoot condition from propagating to the overshoot-insensitive node 532.

As above, the output signal of the first tristate inverter 650 is not affected by the N-bypass transistor 606 providing a path for the undershoot condition to propagate. This is because the undershoot condition only pulls the gate of the N1 transistor 658 to a lower OFF state voltage, keeping the N1 transistor 658 in an OFF state (assuming that the N1 transistor 658 was already in an OFF state).

If, however, the N1 transistor 658 was in an ON state before the particle strike, then the undershoot condition of may cause the N1 transistor 658 to transition to an OFF state. When, under normal operation, the N1 transistor 658 is in an ON state, then the P1 transistor 652 is an OFF state. Since the undershoot condition is blocked by the P-bypass transistor 608, it does not pass to the overshoot-insensitive node 532.

With both the N1 and P1 transistors 658, 652 in an OFF state, the output of the first tristate inverter 650 floats or "tri-states," thereby leaving the output signal of the first tristate inverter 650 unchanged. Table 2 below summarizes the blocking states of the SEU hardening circuit 600 combined with the tristate inverter 650. The states are listed are for exemplary purposes only.

TABLE 2

| Over/ | | | P-bypass | | N-bypass | | P1 Init | | N1 Init | | |
|---|---|---|---|---|---|---|---|---|---|---|---|
| Under | EN | ENN | State | Action | State | Action | State | Result | State | Result | Out |
| Under (0−) | 0 | 1 | (OFF) | Block | (OFF) | Possible Pass | (ON) | No Change | (OFF) | Remains OFF | 1 |
| Under (0−) | 0 | 1 | (OFF) | Block | (OFF) | Possible Pass | (OFF) | No Change | (ON) | Switches OFF | Tristate retain 0 |
| Over (1+) | 0 | 1 | (OFF) | Possible Pass | (OFF) | Block | (ON) | Switches OFF | (OFF) | No Change | Tristate retain 1 |
| Over (1+) | 0 | 1 | (OFF) | Possible Pass | (OFF) | Block | (OFF) | Remains OFF | (ON) | No Change | 0 |

Exemplary Architecture of an Alternative SEU Hardening Circuit

Figure 7:
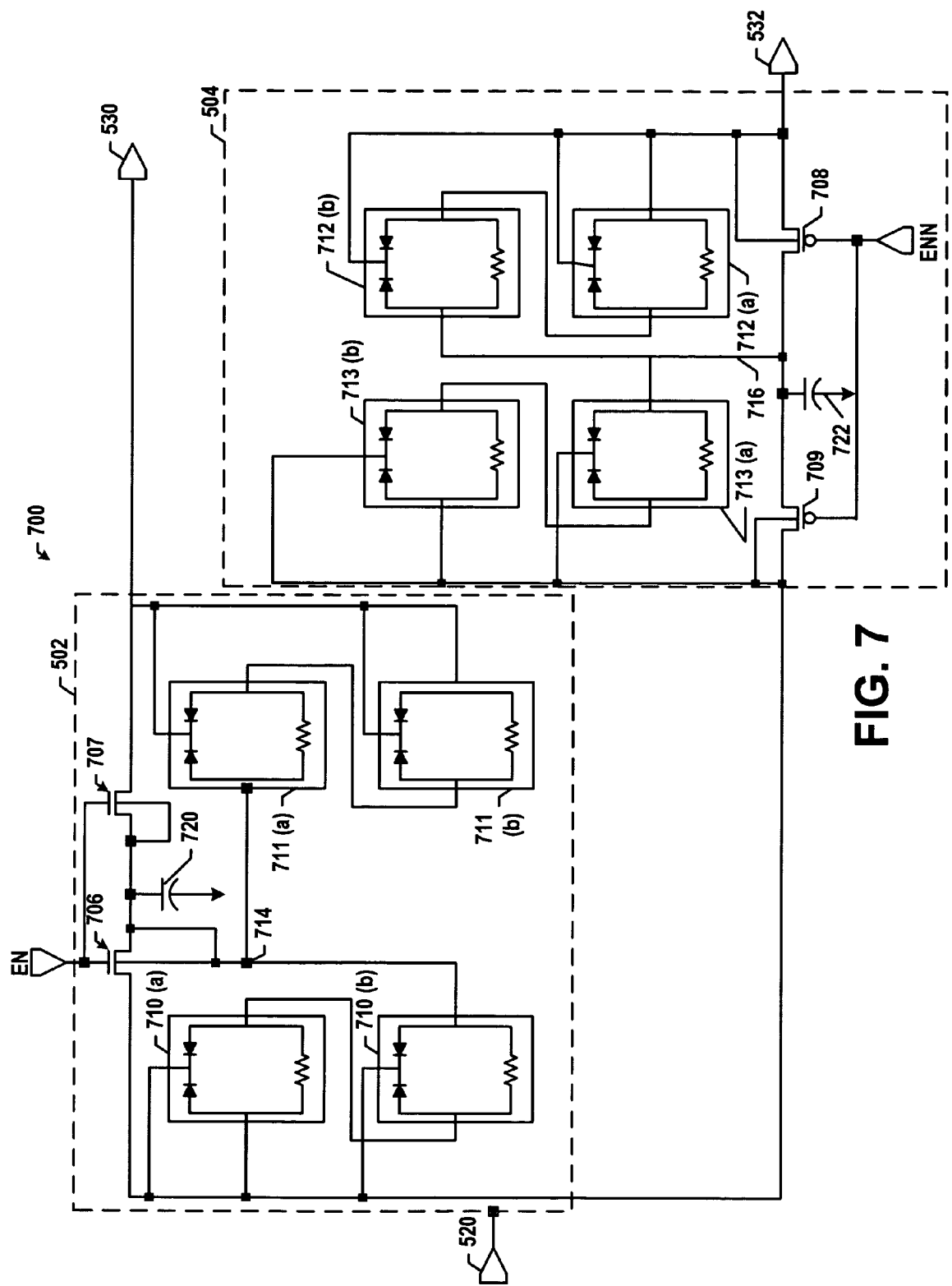
FIG. 7 is a circuit diagram illustrating yet another alternative SEU hardening circuit for providing immunity to voltage overshoot and/or voltage undershoot conditions.

FIG. 7 is a simplified circuit diagram illustrating another alternative SEU hardening circuit 700. Like the SEU hardening circuits 500 and 600, the SEU hardening circuit 700 (or multiples thereof) may be placed between a first and second stage of a larger integrated or integral system.

The SEU hardening circuit 700 is not shown coupled to another device, however, it is recognized that the SEU hardening circuit 700 may be used to drive other circuitry, such as the first tristate inverter 650, or drive other circuitry such as a simple inverter, feed-forward and/or feedback inverter, a latch circuit, and/or flip-flop circuit. Further, the SEU hardening circuit 700 may be used with any type of data storage element including a memory cell, latch, register, etc.

The SEU hardening circuit 700 shown in FIG. 7 is similar to the SEU hardening circuit 600 shown in FIG. 6, except as described herein or otherwise noted. Like the SEU hardening circuit 600, the SEU hardening circuit 700 may be deployed with the overshoot-blocking and undershoot-blocking modules 502, 504.

The overshoot-blocking module 502 may be deployed with (i) a first N-Channel transistor ("N1-bypass transistor") 706, a second N-Channel transistor ("N2-bypass transistor") 707, first and second serially-coupled high-resistance circuits 710a, 710b, and third and fourth serially-coupled high-resistance circuits 711a, 711b. To facilitate the shorting function of the N1-bypass transistor 706, the first and second serially-coupled high-resistance circuits 710a, 710b may be coupled across the source and drain of the N1-bypass transistor 706. Similarly, the third and fourth serially-coupled high-resistance circuits 711a, 711b may be coupled across the source and drain of the N2-bypass transistor 707.

The second and third high-resistance circuits 710b, 711a may be serially coupled together at intermediate node 714. The body tie of the N1-bypass transistor 706 may be coupled to the intermediate node 714, the transistor's drain, and, in turn, a charge storage device, such as a first capacitor 720. The source and body tie of the N2-bypass transistor 707 may also be coupled to the intermediate node 714. As such, the drain and body tie of the N1-bypass transistor 706, the source and body tie of the N2-bypass transistor 707, the capacitor 720, and a tap between the second and third high-resistance circuits 710b, 711a may all be placed at the same potential.

Completing a path from the input node 520 to the undershoot-insensitive node 530, the fourth high-resistance circuit 711b and the drain of the N2-bypass transistor 707 may be coupled to the undershoot-insensitive node 530. As described in more detail below, each of the above noted couplings may not only prevent a overshoot condition from passing to the undershoot-insensitive node 530, but also may prevent further propagation of particle strikes on the sensitive volumes of the N1-bypass and N2-bypass transistors 706, 707.

Referring now to the undershoot-blocking module 504, it may be deployed with (i) a first P-Channel transistor ("P1-bypass transistor") 708, a second P-Channel transistor ("P2-bypass transistor") 709, fifth and sixth serially-coupled high-resistance circuits 712a, 712b, and seventh and eight serially-coupled high-resistance circuits 713a, 713b. The fifth and sixth serially-coupled high-resistance circuits 712a, 712b may be coupled across (and shorted out by) the source and drain of the P1-bypass transistor 708. The seventh and eight serially-coupled high-resistance circuits 713a, 713b may be coupled across (and shorted out by) source and drain of the P2-bypass transistor 709. The sixth and seventh high-resistance circuits 712b, 713a may be serially coupled as well.

The body tie of the P2-bypass transistor 709 may be coupled to its drain, which in turn may be coupled to the input node 520. A second charge storage device, such as second capacitor 722, the source of the P2-bypass transistor 709, the drain of the P1-bypass transistor 708, and a tap between the sixth and seventh high-resistance circuits 712b, 713a may all be coupled to a second intermediate node 716. As such, the source of the P2-bypass transistor 709 and the drain of the P1-bypass transistor 708 may be placed at the same potential.

Completing a path from the input node 520 to the overshoot-insensitive node 532, the fifth high-resistance circuit 712a, and the source and body tie of the P1-bypass transistor 708 may also be coupled to the overshoot-insensitive node 532. As described in more detail below, each of the above noted couplings may not only prevent a undershoot condition from passing to the overshoot-insensitive node 532, but also may prevent further propagation of particle strikes on the sensitive volumes of the P1-bypass and P2-bypass transistors 706, 707.

Although each of the overshoot-blocking and undershoot-blocking modules 502, 504, in the present embodiment has been described using dual bypass transistors, more or less bypassing transistors may be deployed. Moreover, the SEU hardening circuit 700 may contain more or less high-resistance circuits, depending on a desired RC delay.

Each of the hardening high-resistance circuits 710*a–b*, 711*a–b*, 712*a–b*, and 713*a–b* may be constructed from one or more resistive modules and/or components. Each resistive module may be formed from polysilicon, doped silicon, or any other resistive material, element or elements. The resistors may also be constructed in accordance with U.S. Pat. No. 6,180,984, issued on Jan. 30, 2001, and entitled "Integrated Circuit Impedance Device and Method of Manufacture Therefor", which is incorporated herein by reference.

Since the high resistance modules may be fabricated together with the transistors, space constraints (e.g., length and area restrictions) along with limited material properties, such as material resistivity, may prevent fabricating a single resistor having a value large enough to obtain a desired RC constant. By creating multiple hardening high-resistance circuits and serially linking them together, such as hardening high-resistance circuits 710*a–b*, 711*a–b*, a desired RC delay between sensitive volumes of the first stage and the respective undershoot-insensitive or overshoot-insensitive nodes 530, 532 is possible.

As illustrated in FIG. 7, an intrinsic part of the high-resistance circuits 710*a–b*, 711*a–b*, 712*a–b*, and 713*a–b* are two serially-connected diodes. The anodes of the diodes are commonly coupled, whereas each of the cathodes is coupled to an end of the resistor modules. The diodes are connected in parallel with the source and drain junction diodes of bypass transistors 707–709 such that in any bias condition there will always be two reverse biased diodes in series between nodes 530 or 532 and node 520. More or less than two serial diodes may be connected in series, depending on the number of high resistance modules that are serially linked together. If improperly connected the diodes could provide an unintentional shorting path around the high-resistance circuits rendering them ineffective.

Exemplary Operation of the Alternative SEU Hardening Circuit

When data on the input node 520 is in a logic-1 state, the EN signal is in a logic-1 state, and the ENN signal is in a logic-0 state, then the N1-bypass and N2-bypass transistors 706, 707 are in an ON state, thereby shorting serially-coupled high-resistance circuits 710*a*, 710*b*, 711*a*, 711*b*. The P1-bypass and P2-bypass transistors 708, 709 are also in an ON state, shorting the serially-coupled high-resistance circuits 712*a*, 712*b*, 713*a*, 713*b*. As such, the undershoot-insensitive node and overshoot-insensitive nodes 530, 532 are in a logic-1 state; albeit, the undershoot-insensitive node 530 might not be at a full-rail logic-1 state.

Similarly, when data present on the input node 520 is in a logic-0 state, the EN signal is in a logic-1 state and the ENN signal is in a logic-0 state, then the N1-bypass, N2-bypass, P1-bypass, and P2-bypass transistors 706–709 are in an ON state, thereby shorting serially-coupled high-resistance circuits 710*a*, 710*b*, 711*a*, 711*b*, 712*a*, 712*b*, 713*a*, and 713*b*. As such, the undershoot-insensitive node and overshoot-insensitive nodes 530, 532 are in a logic-0 state. The overshoot-insensitive node 532, however, might not be at a full-rail logic-0 state.

If, however, the EN signal is in a logic-0 state and the ENN signal is in a logic-1 state, then each of the N1-bypass, N2-bypass, P1-bypass, and P2-bypass transistors 706–709 are in an OFF state. When the N1-bypass, N2-bypass, P1-bypass, and P2-bypass transistors 706–709 are in OFF states, then, under desired operation, the undershoot-insensitive and overshoot-insensitive nodes 530, 532 remain in their respective last states, due in part to a charge mechanism (not shown), such as a capacitor and/or the capacitance of the transistors themselves, coupled to the transistor's gates. Table 3 below summarizes the typical operational states of the SEU Hardening Circuit 700.

TABLE 3

| Input (IN) | EN | ENN | N1-bypass | N2-bypass | P1-bypass | P2-bypass | Overshoot-insensitive node | Undershoot-insensitive Node |
|---|---|---|---|---|---|---|---|---|
| 0 | 0 | 1 | OFF | OFF | OFF | OFF | Last State | Last State |
| 1 | 0 | 1 | OFF | OFF | OFF | OFF | Last State | Last State |
| 0 | 1 | 0 | ON | ON | ON | ON | ON | OFF |
| 1 | 1 | 0 | ON | ON | ON | ON | OFF | ON |

When the SEU hardening circuit 700 is in an OFF state and a particle strikes a device in the first stage that causes the input node 520 to experience an overshoot condition, this condition can (i) turn on the P2-bypass transistor 709, (ii) charge the second capacitor 722 to a high state, and, in turn, (iii) turn on the P1-bypass transistor 708. As such, the overshoot condition may be passed to the overshoot-insensitive node 532.

Since the overshoot-insensitive node 532 is to be coupled to the overshoot-insensitive inputs of the second stage, the overshoot condition does not turn on the second stage, and thereby prevents further propagation of the overshoot condition. Furthermore, the PN junctions of the P1-bypass and P2-bypass transistors 708, 709 (e.g., the body tie-to-drain and body-tie-to-source connections) and the charge in the capacitor 722 may also dissipate the overshoot condition before it reaches the overshoot-insensitive node 532. This, however, may slow down the response of the SEU hardening circuit 700 as the current caused by the overshoot condition dissipates. This typically requires a recharge of the capacitor 722, which can occur during a later cycle.

The overshoot condition, on the other hand, is blocked by the N1-bypass transistor 706. This prevents the overshoot condition from passing to the undershoot-insensitive node 732. Consequently, the SEU hardening circuit 700 protects against further propagating the overshoot conditions to the second stage.

When a undershoot condition is experienced on the input node 520, the N1-bypass transistor 706 may be turned on. In turn, the first capacitor 720 may be pulled to a low state, which may turn on the N1-bypass transistor 707. As such, the undershoot condition may be passed to the undershoot-insensitive node 530. This undershoot condition, however, does not turn on the undershoot-insensitive inputs of the second stage, and thereby prevents further propagation of the overshoot condition.

Like above, the PN junctions of the N1-bypass and N2-bypass transistors 706, 707 and the charge in the capacitor 720 may also dissipate the undershoot condition before it reaches the undershoot-insensitive node 530. Such absorption, however, may slow down the response of the SEU hardening circuit 700 as the current caused by the undershoot condition dissipates. This typically requires a recharge of the capacitor 720, which can occur during a later cycle.

Mirroring the overshoot protection noted above, the undershoot condition is blocked by the P2-bypass transistor 709. This prevents the undershoot condition from passing to the overshoot-insensitive node 532. Consequently, the SEU hardening circuit 700 protects against further propagating the undershoot conditions to the second stage. Furthermore, additional levels of hardening may be provided by transistor fabrication and configuration.

Transistor-Configuration Hardening of an SEU Hardening Circuitry

Referring back to FIG. 6, the body ties of the N-bypass and P-bypass transistors 606, 608 may be left unconnected or "floating" as shown. Alternatively, the body tie of the N and P-bypass transistors 606, 608 may be connected to $V_{SS}$ and $V_{DD}$, respectively. Connecting the body ties to $V_{SS}$ and $V_{DD}$ for N-bypass and P-bypass transistors may be warranted when bulk CMOS technology is used. In such case, the substrate and well connections are generally coupled in common with many transistors, and typically can not be left floating.

If the body nodes of the N-bypass and P-bypass transistors 606, 608 are floating and if the input node 520 and undershoot-insensitive node 530 are in a high state for a long enough period, the body tie of the N-bypass transistor 606 may also be in a high state due to charging of the body node by reverse leakage current. When the input node 520 transitions from high to low, the diode between the input node 520 and the body tie of the N-bypass transistor becomes forward biased. The resulting voltage on the body of the N-bypass transistor is $V_{SS}+V_{dfwr}$ (where $V_{dfwr}$ is the diode forward bias voltage, which may be about 0.7 volts). Similarly, the body voltage of the P-bypass transistor may be $V_{DD}-V_{dfwr}$ after a low to high transition on the input node 520.

Regardless of whether the body nodes are left floating or are tied to $V_{SS}$ and/or $V_{DD}$, particle strikes may result in the overshoot-insensitive node 532 charging to $V_{DD}$ or undershoot-insensitive node 530 discharging to $V_{SS}$, but may not result in an upset in the latch circuit. For example, when the undershoot-insensitive node 530 is in a high state, a PN junction between such node and the substrate of the N-bypass transistor 606 may be reverse biased. The resulting depletion region in the N-bypass transistor 606 may create a sensitive volume on undershoot-insensitive node 530. When this sensitive volume is struck by a radiation particle, the undershoot-insensitive node 530 might charge to a low state.

Similarly, when overshoot-insensitive node 532 is in a low state, the PN junction between it and the substrate of the P-bypass transistor 608 may be reverse biased. The resulting depletion region may also create a sensitive volume on the overshoot-insensitive node 532. When this sensitive volume struck by a particle, it might be charged to a high state.

When the input node 520 and the undershoot-insensitive node 530 are in a high state and the body tie of the N-bypass transistor 606 is at $V_{SS}+V_{dfwr}$, the PN junction between undershoot-insensitive node 530 and the body tie of the N-bypass transistor 606 is reverse biased. The resulting depletion region in the N-bypass transistor 606 might create a sensitive volume on the undershoot-insensitive node 530.

A particle strike in this depletion region may discharge the undershoot-insensitive node 530 and charge the body tie of the N-bypass transistor 606, especially because the body tie of the N-bypass transistor 606 is not actively driven low. If, however, the capacitance of the body tie of the N-bypass transistor 606 is much less than the capacitance on the undershoot-insensitive node 530, then a particle strike on the sensitive volume of the undershoot-insensitive node 530 may not cause the undershoot-insensitive node 530 to discharge.

When the capacitance of the body tie of the N-bypass transistor 606 is on the same order as the capacitance on the undershoot-insensitive node 530, then the voltage on the undershoot-insensitive node 530 may discharge to about $V_{DD}/2$ or less. The final voltage values, however, may depend on the relative capacitance between body tie of the N-bypass transistor 606 and the undershoot-insensitive node 530.

If the voltage level on the undershoot-insensitive node 530 becomes less than $V_{tn}$ (i.e., less than the threshold or turn-on voltage of the N1 transistor 658), then the output of the first tristate inverter 650 tristates. The voltage level on node 646 may be maintained in its last state by a charge storage mechanism (not shown). Therefore, the discharge on the undershoot-insensitive node does not result in a SEU in the latch circuit 680. The P-bypass transistor 608 may behave in a similar matter, except that the voltages are complements of those described above.

If the body ties of the N-bypass and P-bypass transistors 606, 608 are connected to $V_{SS}$ and $V_{DD}$, respectively, then particle strikes may result in the overshoot-insensitive node 532 charging to $V_{DD}$ or undershoot-insensitive node 530 discharging to $V_{SS}$. The response of transistors 606, 608 are similar to the behavior with floating body ties, described above, except that (i) the body voltage is constant and does not depend on the switching history of the input, undershoot-insensitive and overshoot-insensitive nodes 520, 530 and 532, and (ii) the body ties are connected to $V_{DD}$ or $V_{SS}$, thereby providing a source or sink for the charging or discharging current provided by the particle strike.

A particle strike may potentially trigger a parasitic Bipolar Junction Transistor ("BJT") (not shown) to turn on, thereby shorting the N-bypass transistor 606 and P-bypass transistor 608 and causing the N-bypass transistor 606 and P-bypass transistor 608 to bypass the high-resistance circuits 610, 612. Under normal operation, the voltage level on the input node 520 is the same as the voltage level on nodes 530 and 532 (neglecting, for example, a voltage drop due to driving node 532 low through a PMOS transistor or driving node 530 high through an NMOS transistor). When a radiation particle causes a parasitic BJT to short out either the N-bypass transistor 606 or P-bypass transistor 608, then the parasitic BJT would simply reinforce the preexisting voltage level on nodes 530 and 532 (assuming that the parasitic BJT is only subjected to single particle strikes and hence the term—single event).

Referring again to FIG. 7, the N1-bypass, N2-bypass, P1-bypass and P2-bypass transistors 706, 707, 708, 709 may be configured in a way to provide additional immunity against single or multiple particle strikes. For example, the body ties of the N1-bypass and N2-bypass transistor 706, 707, and the body ties of the P1-bypass and P2-bypass transistors 708, 709 may be configured to prevent propagation of SEU conditions. Preferably, the SEU Hardening circuit 700 is fabricated using a device-insulating process, such as a Silicon-on-Insulator ("SOI") process, instead of bulk technology.

Such process eliminates pwell or nwell junctions associated with the body ties of the N1-bypass and N2-bypass transistors 706, 707, and the P1-bypass and P2-bypass transistors 708, 709, respectively, thereby reducing the potential sensitive volume. Additionally, use of SOI technology allows the body ties to be connected to the transistors source or drain, instead of $V_{DD}$ or $V_{SS}$, as is traditionally done with bulk technology. A connection to source or drain provides additional SEU immunity over a connection to $V_{DD}$ or $V_{SS}$, as described below.

When the N1-bypass, N2-bypass, P1-bypass and P2-bypass transistors 706, 707, 708, 709 are in ON states, then all the nodes of the SEU hardening circuit 700 are at about the same potential, including the first and second intermediate nodes 714, 716. Thus, with no reverse biased junctions and no voltage gradients in the silicon, there are no sensitive volumes associated with the N1-bypass, N2-bypass, P1-bypass and P2-bypass transistors 706, 707, 708, 709. This condition may be made possible by connecting the body ties of the N1-bypass, N2-bypass, P1-bypass and P2-bypass transistors 706, 707, 708, 709 to the appropriate source or drain, instead of leaving the body floating or connecting it to $V_{DD}$ or $V_{SS}$.

Connecting the body of the N1-bypass, N2-bypass, P1-bypass and P2-bypass transistors 706, 707, 708, 709 to their source or drain may result in a forward biased diode under certain bias conditions. Therefore, two transistors may be connected in series with opposing diode directions, as shown in FIG. 7, such that at least one diode is reverse biased diode between the input node 520 and 530 and between node 520 and 532 (e.g., the N1-bypass and N2-bypass transistors 706 and 707).

Other exemplary body tie connections are described in the aforementioned U.S. patent application Ser. No. 10/759913. Furthermore, the P1-bypass and P2-bypass transistors 708, 709 may be configured to operate in a similar matter, but with complementary voltages and couplings.

CONCLUSION

In view of the wide variety of embodiments to which the principles of the present invention can be applied, it should be understood that the illustrated embodiments are exemplary only, and should not be taken as limiting the scope of the present invention. For example, the steps of the operational modes may be taken in sequences other than those described, and more or fewer elements may be used in the block diagrams. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention. It will be understood, however, that changes and modifications may be made to the invention without deviating from its true spirit and scope, as defined by the following claims.

What is claimed is:

1. An apparatus for hardening logic circuitry against a Single-Event-Effect condition and for providing immunity to an overshoot and undershoot condition, the apparatus comprising:

an undershoot-blocking module that is configured to be coupled to an overshoot-insensitive node of the logic circuitry, wherein the undershoot-blocking module is operable to (i) receive from a first node of the logic circuitry a first signal event having a undershoot condition impressed thereon, and (ii) block the first signal event from passing to the overshoot-insensitive node, thereby preventing further propagation of the undershoot condition; and a overshoot-blocking module that is configured to be coupled to an undershoot-insensitive node of the logic circuitry, wherein the overshoot-blocking module is operable to (i) receive from the first node a second signal event having a overshoot condition impressed thereon, and (ii) block the second signal event from passing to the undershoot-insensitive node, thereby preventing further propagation of the overshoot condition.

2. The apparatus of claim 1, wherein the undershoot-blocking module is further operable to receive the second signal event from the first node and to pass it to the overshoot-insensitive node, whereby the overshoot-insensitive node prevents further propagation of the overshoot condition.

3. The apparatus of claim 1, wherein the overshoot-blocking module is further operable to receive the first signal event from the first node and to pass it to the undershoot-insensitive node, whereby the undershoot-insensitive node prevents further propagation of the undershoot condition.

4. The apparatus of claim 1, wherein the undershoot-blocking module is operable to provide a high-impedance signal path between the first node and the overshoot-insensitive node when operating in a first state, and wherein the undershoot-blocking module is operable to provide a low resistance path between the first node and the overshoot-insensitive node when operating in a second state.

5. The apparatus of claim 1, wherein the undershoot-blocking module is operable to provide to the overshoot-insensitive node a full-rail logic-1 signal.

6. The apparatus of claim 1, wherein the overshoot-blocking module is operable to provide a high-impedance signal path between the first node and the undershoot-insensitive node when operating in a first state, and wherein the overshoot-blocking module is operable to provide a low resistance path between the first node and the undershoot-insensitive node when operating in a second state.

7. The apparatus of claim 1, wherein the overshoot-blocking module is operable to provide to the undershoot-insensitive node a full-rail logic-0 signal.

8. The apparatus of claim 1, wherein the undershoot-blocking module comprises radiation-hardened circuitry.

9. The apparatus of claim 1, wherein the overshoot-blocking module comprises radiation hardened circuitry.

10. The apparatus of claim 1, wherein the undershoot-blocking module is fabricated using a bulk silicon technology.

11. The apparatus of claim 1, wherein the overshoot-blocking module is fabricated using a bulk silicon technology.

12. The apparatus of claim 1, wherein the undershoot-blocking module is fabricated using a device-insulating technology.

13. The apparatus of claim 12, wherein the device-insulating technology comprises a silicon-on-insulator technology.

14. The apparatus of claim 12, wherein the device-insulating technology comprises a silicon-on-insulator technology.

15. The apparatus of claim 1, wherein the overshoot-blocking module is fabricated using a device-insulating technology.

16. The apparatus of claim 1, wherein the undershoot-blocking module comprises first and second P-Channel transistors coupled in series, wherein the first P-Channel transistor has its source configured to be coupled to an overshoot-insensitive node of the logic circuitry and its drain configured to be coupled to the source of the second P-Channel transistor, and wherein the drain of the second P-Channel transistor is configured to be coupled to the first node of the logic circuitry.

17. The apparatus of claim 16, wherein the undershoot-blocking module further comprises at least one resistance module coupled in parallel with the first and second P-Channel transistors to provide a high impedance path between the first node and the overshoot-insensitive node, and wherein when enabled, the first and second P-Channel transistors are operable to provide a low resistance path around the at least one resistance module.

18. The apparatus of claim 16, wherein the undershoot-blocking module further comprises at least one first resistance module coupled in parallel with the first and second P-Channel transistors to provide a high impedance path between the first node and the overshoot-insensitive node, wherein when enabled, the first and second P-Channel transistors are operable to provide a low resistance path around the at least one first resistance module, wherein the overshoot-blocking module further comprises at least one second resistance module coupled in parallel with the first and second N-Channel transistors to provide a high impedance path between the first node and the undershoot-insensitive node, and wherein when enabled, the first and second N-Channel transistors are operable to provide a low resistance path around the at least one second resistance module.

19. The apparatus of claim 1, wherein the overshoot-blocking module comprises first and second N-Channel transistors coupled in series, wherein the first N-Channel transistor has its drain configured to be coupled to an undershoot-insensitive node of the logic circuitry and its source configured to be coupled to the drain of the second N-Channel transistor, and wherein the source of the second N-Channel transistor is configured to be coupled to the first node of the logic circuitry.

20. The apparatus of claim 19, wherein the overshoot-blocking module further comprises at least one resistance module coupled in parallel with the first and second N-Channel transistors to provide a high impedance pat between the first node and the undershoot-insensitive node, wherein when enabled, the first and second N-Channel transistors are operable to provide a low resistance pat around the at least one resistance module.

21. The apparatus of claim 1, wherein the logic circuitry comprises a device selected from the group of a tri-state inverter, an inverter, a latch, a flip-flop, a data storage element, a memory cell, and a register.

22. An apparatus for hardening logic circuitry against a Single-Event-Effect condition and for providing immunity to an overshoot and undershoot condition, the apparatus comprising:
a P-Channel transistor having its source configured to be coupled to an overshoot-insensitive node of the logic circuitry and its drain configured to be coupled to a first node of the logic circuitry, wherein the P-Channel transistor is operable to (i) receive from the first node a first signal event having a undershoot condition impressed thereon, and (ii) block the first signal event from passing to the overshoot-insensitive node, thereby preventing further propagation of the undershoot condition; and
an N-Channel transistor having its drain configured to be coupled to an undershoot-insensitive node of the logic circuitry and its source configured to be coupled to the first node, wherein the N-Channel transistor is operable to (i) receive from the first node a second signal event having an overshoot condition impressed thereon, and (ii) block the second signal event from passing to the undershoot-insensitive node, thereby preventing further propagation of the overshoot condition.

23. The apparatus of claim 22, wherein the P-Channel transistor is further operable to receive the second signal event from the first node and to pass it to the overshoot-insensitive node, whereby the overshoot-insensitive node prevents further propagation of the overshoot condition, and wherein the N-Channel transistor is further operable to receive the first signal event Thorn the first node and to pass it to the undershoot-insensitive node, whereby the undershoot-insensitive node prevents further propagation of the undershoot condition.

24. The apparatus of claim 22, further comprising at least one resistance module coupled in parallel with the P-Channel transistor to provide a high impedance path between the first node and the overshoot-insensitive node, wherein when enabled, the P-Channel transistor is operable to provide a low resistance path around the at least one resistance module.

25. The apparatus of claim 24, wherein the P-Channel transistor is operable to provide to the overshoot-insensitive node a fail-rail logic-1 signal level.

26. The apparatus of claim 22, wherein the P-Channel transistor is operable to provide to the overshoot-insensitive node a full-rail logic-1 signal level.

27. The apparatus of claim 22, further comprising at least one resistance module coupled in parallel with the N-Channel transistor to provide a high impedance path between the first node and the undershoot-insensitive node, wherein when enabled, the N-Channel transistor is operable to provide a low resistance path around the at least one resistance module.

28. The apparatus of claim 27, wherein the N-Channel transistor is operable to provide to the undershoot-insensitive node a full-rail logic-0 signal level.

29. The apparatus of claim 22, wherein the N-Channel transistor is operable to provide to the undershoot-insensitive node a hill-rail logic-0 signal level.

30. A method for hardening logic circuitry against Single-Event-Effect conditions for providing immunity to overshoot and undershoot conditions comprising an undershoot-blocking module and an overshoot blocking module wherein the undershoot-blocking module is configured to be coupled between a first node and an overshoot-insensitive node of the logic circuitry, and wherein the overshoot-blocking module is configured to be coupled between the first node and an undershoot-insensitive node of the logic circuitry, the method comprising:
receiving at the undershoot-blocking module from the first node a first signal event having a undershoot condition impressed thereon;
blocking the first signal event from passing to the overshoot-insensitive node, thereby preventing further propagation of the undershoot condition;
receiving at the overshoot-blocking module from the first node a second signal event having a overshoot condition impressed thereon; and blocking the second signal event from passing to the undershoot-insensitive node, thereby preventing further propagation of the overshoot condition.

31. The method of claim 30, further comprising:

receiving at the undershoot-blocking module from the first node the second signal event, and passing the second signal event to the overshoot-insensitive node, whereby the overshoot-insensitive node prevents further propagation of the overshoot condition.

32. The method of claim 30, further comprising:

receiving at the overshoot-blocking module from the first node the first signal event; and passing the first signal event to the undershoot-insensitive node, whereby the undershoot-insensitive node prevents further propagation of the undershoot condition.

33. The method of claim 30, further comprising providing a full-rail logic-1 signal from the undershoot-blocking module to the overshoot-insensitive node; and providing a full-rail logic-0 signal from the overshoot-blocking module to the undershoot-insensitive node.

* * * * *

UNITED STATES PATENT AND TRADEMARK OFFICE
CERTIFICATE OF CORRECTION

PATENT NO.         : 7,215,135 B2                                            Page 1 of 1
APPLICATION NO. : 11/002163
DATED              : May 8, 2007
INVENTOR(S)        : Roy M. Carlson It is certified that error appears in the above-identified patent and that said Letters Patent is hereby corrected as shown below:

Col 21, Line 48
In Claim 20, replace "pat" with --path--

Line 51
In Claim 20, replace "pat" with --path--

Col 22, Line 19
In Claim 23, replace "Thorn" with --from--

Line 32
In Claim 25, replace "fail rail" with --full-rail--

Line 48
In Claim 29, replace "hill-rail" with --full-rail--

Signed and Sealed this

Thirteenth Day of November, 2007

JON W. DUDAS
*Director of the United States Patent and Trademark Office*